United States Patent
Confalonieri et al.

(10) Patent No.: US 8,427,196 B2
(45) Date of Patent: Apr. 23, 2013

(54) SYSTEM FOR PROCESSING ANALOG-TYPE ELECTRICAL SIGNALS WITH LOW NOISE DRIVING DEVICE

(75) Inventors: Pierangelo Confalonieri, Milan (IT); Federico Guanziroli, Milan (IT); Marco Zamprogno, Milan (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 321 days.

(21) Appl. No.: 12/893,848

(22) Filed: Sep. 29, 2010

(65) Prior Publication Data

US 2011/0095610 A1    Apr. 28, 2011

(30) Foreign Application Priority Data

Sep. 30, 2009  (IT) .............................. MI2009A1683

(51) Int. Cl.
   *H03K 17/16*   (2006.01)
   *H03K 19/003*  (2006.01)

(52) U.S. Cl.
   USPC ................... 326/21; 326/23; 326/26; 326/27

(58) Field of Classification Search .................. None
   See application file for complete search history.

(56) References Cited

U.S. PATENT DOCUMENTS 8,143,934 B1 * 3/2012 Shutt et al. .................... 327/404
8,310,301 B2 * 11/2012 Maier ........................... 327/564
2008/0043540 A1   2/2008 Boemler

FOREIGN PATENT DOCUMENTS

JP       2004297165       10/2004

* cited by examiner

*Primary Examiner* — Anh Tran
(74) *Attorney, Agent, or Firm* — Allen, Dyer, Doppelt, Milbrath & Gilchrist, P.A.

(57) ABSTRACT

A system includes analog supply circuitry providing first and second analog potentials. A switch module assumes first or second states to enable and inhibit transfer of an analog electrical signal from a source module to a user module based upon a driving electrical signal. A driving device drives, based upon the driving electrical signal, a control terminal of the switch module, allowing the switch module to assume the first or second state. The driving device allows the switch module to make a first driving transition from the first state to the second state, and a second driving transition from the second state to the first state. The driving device alternately connects the control terminal to a first reference potential, during the first state, and to a second reference potential, during the second state. The driving device connects the control terminal of the switch module to a third reference potential electrically distinct from the first and the second analog potentials, during each of the time intervals associated to the first or second driving transitions of the switch module.

20 Claims, 4 Drawing Sheets

SYSTEM FOR PROCESSING ANALOG-TYPE ELECTRICAL SIGNALS WITH LOW NOISE DRIVING DEVICE

FIELD OF THE INVENTION

The present disclosure relates to electronic and/or microelectronic) systems for the processing of analog-type electrical signals through the use of an analog circuitry and a digital circuitry.

BACKGROUND OF THE INVENTION

In a processing (electronic and/or micro-electronic) system of analog-type electrical signals (hereinafter, for brevity's sake simply being referred to as analog signals), a switch module (switch) is typically employed in particular applications, which is capable of enabling and inhibiting the transfer of an analog signal from a source module to a user module.

For example, in an Analog-to-Digital converter system ADC, the switch module is employed, as it is known, for a sampling function, by storing the analog signal value while the switch module results to be in the so-called "off" state.

In a Digital-to-Analog Converter system DAC, the switch module is also employed for the transfer of an analog signal towards an amplification stage, in predetermined time instants in which the same results to be in the so-called "on" state.

A helpful function is a switch module that is used in such systems is that of transferring the analog signal, on which it operates, in q reliable way. In other words, it is desired that the noise and/or the distortion added by the switch module to the transferred analog signal are reduced as much as possible (being ideally equal to zero).

Typically, a switch module operating on analog signals is driven by a corresponding control digital circuitry, having the task of generating control logic signals of the switch module and to provide to it, through a driving device, a driving electrical signal, on the basis of the above-mentioned control logic signals, to allow the opening (state "off") or the closure (state "on") of the switch module.

Such a driving device has the drawback of further perturbing the analog signal on which the switch module operates, adding noise and/or distortion to it, even in a significant amount. This is due to the fact that such a driving device takes the driving electrical signal from a supply circuitry internal to the electronic and/or micro-electronic system for the processing of analog electrical signals.

In particular, with respect to such supply circuitry, it is pointed out that such a system usually comprises two different types of circuitry: analog supply circuitry, to which the system analog circuitry is electrically connected; and digital supply circuitry, to which the system digital circuitry is electrically connected.

As it is known, the analog supply is capable of providing, in a plurality of analog supply terminals, a first and a second analog supply potentials, while the digital supply is capable of providing, in a plurality of digital supply terminals, first and second digital supply potentials.

Such first supply potentials (both analog and digital) can originate from, or coincide with, first external supply potential, having a same nominal value one to the other. Similarly, such second supply potentials (both analog and digital) can originate from, or coincide with, a second external supply potential, having a same nominal value one to the other. Such first and second external supply potentials can be, for example, obtained from a battery.

However, the real instantaneous values of such supply potentials can vary, departing from the nominal value. Particularly, the digital supply is usually characterized by a higher switch noise, associated to the switching operations of the digital components connected thereto.

The availability of two supply circuitries is a compromise that is usually adopted among the availability of an individual supply circuitry, that would lead to a degraded performance mainly due to excessive undesired mutual influences determined by the different operating modes of the digital components and the analog components, and the availability of a number of different supply circuitries, to which single subsystems of the system would refer, which would improve the performance by minimizing the mutual influences, but would lead to unacceptable costs and space waste.

Typically, the switch module control circuitry is connected to the digital supply. In such a scenario, the corresponding driving device is to be connected to the digital supply, which may be the last control circuitry component before the switch module, and which directly interacts with the same switch module through the driving electrical signal.

The driving device, connected to the digital supply, has a drawback in that it transfers at least partially on the switch module, and therefore on the analog signal on which it operates, the switch noise that is present on the digital supply. Particularly, the noise is present both in the periods in which the switch module is "on" and in those in which it is "off".

Therefore, the general need of employing a driving device that minimizes the noise transferred from it to the switch module is strongly felt.

A known approach to cope with such drawback is the use of a driving device that is connected to the analog supply (which, as it is known, is already available) instead of being connected to the digital supply. This solution exploits the advantage that the analog supply, as it is known, has a noticeably lower noise compared to the digital one, since the switch noise of the digital components, which are connected to the digital supply, is not present therein.

However, such solution, while on one hand reducing the drawback due to the switch noise, has the disadvantage of introducing further distortions on the analog signal on which the switch module operates. This is due to the fact that the driving device switching currents, during the time intervals associated to the switch module transition from one to the other of the relative states ("on", "off"), may be suddenly variable.

In this scenario, such currents flow through the analog supply terminals, thus perturbing the already mentioned analog supply potential values. In fact, such switching currents create undesired voltages on the non-zero resistances of the internal supply paths. Furthermore, the perturbations induced by the switching currents on the analog supply, caused for example by stray phenomena, particularly related to the inductance, on the analog supply bondings, are particularly serious. In fact, besides distorting the analog signal on which the switch module operates, they affect the operation of the entire system analog circuitry, connected to such supply, thereby reducing the performance thereof.

The object of the present disclosure is to provide an improved system for the processing of analog electrical signals.

SUMMARY OF THE INVENTION

A system for processing analog electrical signals may include analog circuitry supply circuitry configured to provide first and second analog supply potentials. A switch module may have a control terminal and may be switchable between a first state and a second state to thereby enable and inhibit, respectively, transfer of an analog electrical signal from a source module to a user module, based upon a driving electrical signal.

In addition, a driving device may be configured to drive, based upon the driving electrical signal, the control terminal of the switch module, to cause the switch module to assume one of the first state and the second state, the driving device further allowing the switch module to carry out a first driving transition from the first state to the second state and a second driving transition from the second state to the first state. The driving device may be configured to alternately couple the control terminal to a first reference potential during the first state and to a second reference potential during the second state.

Also, the driving device may be further configured to couple the control terminal of the switch module to a third reference potential electrically distinct from the first and second analog supply potentials, during each time interval associated with at least one of the first and second driving transitions of the switch module.

The driving device may be configured to couple the control terminal of the switch module to a fourth reference potential electrically distinct from the first and second analog supply potentials, and the control terminal may be coupled to the third and fourth reference potentials during each time interval associated to the first and second transitions of the switch module, respectively. In some applications, the first reference potential and the second reference potential may be based upon the first analog supply potential and the second analog supply potential, respectively.

Digital supply circuitry may be configured to provide first and a second digital supply potentials, and the third reference potential and the fourth reference potential may be based upon the first digital supply potential and the second digital supply potential, respectively. The driving device may include a driving stage, and digital control circuitry may be configured to provide at least one system control signal to the driving device. The control module may be configured to generate a plurality of driving control signals based upon the at least one system control signal.

The driving stage may be configured to generate the driving electrical signal based upon the plurality of driving control signals. The driving stage may comprise a first transistor having a first source terminal coupled to the first reference potential, a first gate terminal coupled to the control module to receive a first control signal of the plurality of driving control signals, and a first drain terminal coupled to the control terminal of the switch module. The driving stage may further comprise a second transistor having a second drain terminal coupled to the first drain terminal of the first transistor, a second gate terminal coupled to the control module to receive a second control signal of the plurality of driving control signals, and a second source terminal coupled to the second reference potential.

The driving stage further may comprise a further transistor having a further drain terminal coupled to the first drain terminal of the first transistor, a further gate terminal coupled to the control module to receive a further control signal of the plurality of driving control signals, and a further source terminal coupled to the fourth reference potential. The driving stage may include another transistor having another source terminal coupled to the third reference potential, another gate terminal operatively coupled to the control module to receive another control signal of the plurality of driving control signals, and a further drain terminal coupled to the first drain terminal of the first transistor.

BRIEF DESCRIPTION OF THE DRAWINGS

Further characteristics and advantages of the analog electrical signals processing system according to the disclosure will result from the description reported below of preferred embodiments, given by way of non-limiting example, with reference to the annexed Figures, in which.

DETAILED DESCRIPTION OF THE PREFERRED EMBODIMENTS

Figure 1:
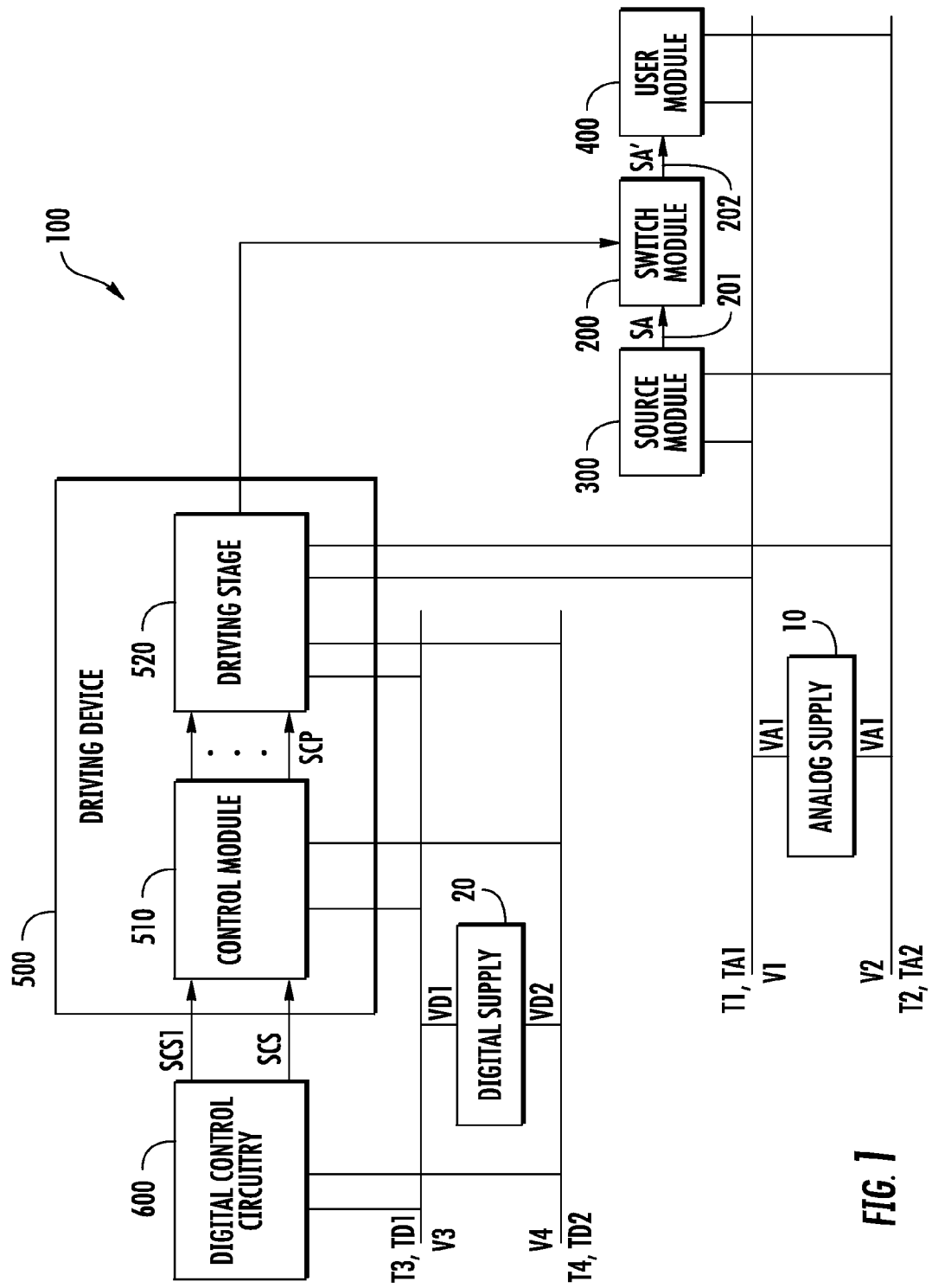
FIG. 1 schematically shows an electronic system according to an example of this disclosure.

With reference to FIG. 1, a processing system of analog electrical signals is now described, indicated on the whole by the reference numeral 100, according to an example of the present disclosure.

To the aims of the present description, by A processing system of analog electrical signals, it is meant an electronic and/or micro-electronic system, preferably manufactured by integrated technology (on chip), designed to carry out on such signals, by the use of an analog circuitry and a digital circuitry, one of more functions and/or operations, such as, for example, switching, signal transfer, analog-to-digital conversion, digital-to-analog conversion, and so on.

It shall be noticed that the subsystems comprised in the processing system of analog electrical signals according to the disclosure, that will be described herein below, can be implemented without distinction in a single chip or by a plurality of chips. The processing system of analog electrical signals that will be described herein below is independent from the choice of the implementation partitioning of the various subsystems between one or more chips.

The processing system 100 comprises a source module 300 of an analog electrical signal SA, hereinafter also simply analog signal. The processing system 100 further comprises a user module 400, suitable to receive, on request, the analog signal SA generated by the source module 300. It is pointed out that the type of the source module 300 and of the user module 400 depends on the type of functions and/or operations that are carried out by the processing system 100. The processing system 100 further comprises a switch module 200, per se known, operatively connected between the source module 300 and the user module 400.

Particularly, the switch 200 comprises an input terminal 201 arranged to receive in input the analog signal SA, and an output terminal 202, to provide the analog signal SA to the user module 400, when desired. From an operative point of view, the switch module 200 results is configured so as to assume a first or a second state, in order to enable and inhibit, respectively, the transfer of the analog signal SA from the source module 300 to the user module 400, on the basis of a driving electrical signal SP (for brevity's sake hereinafter also referred to as driving signal), that will be described below.

It shall be noticed that in the first state (also referred to as "switched on", or "on"), the switch module 200 behaves as a closed switch; in the second state (also referred to as "switched off", or "off"), the switch module 200 behaves as an open switch.

Referring to FIG. 1, it shall be noticed that the analog signal that is present on the output terminal 202 is identified by the reference SA'. In the light of the mentioned operating mode of the switch module 200, the analog signal SA' is ideally equal to the analog signal SA when the switch module 200 assumes the first state, and it is equal to 0 (null signal) when the switch module 200 assumes the second state. In practice, such analog signal SA' departs from the above-mentioned ideal trend, because of the noise or of other disturbance types.

The processing system 100 further comprises a driving device 500 of the switch module 200. In more detail, the driving device 500 is configured to drive, based upon the driving signal SP, a control terminal TC which the switch module 200 is provided with, so as to allow it to assume the first or the second state and to carry out a first driving transition type (hereinafter for brevity's sake also referred to as "first driving transition") from the first state to the second state, and a second driving transition type (hereinafter for brevity's sake also referred to as "second driving transition") from the second state to the first state.

It is pointed out that the first and the second transition types are intrinsically associated to the dynamic operation of the switch module 200. Particularly, as it is known, each specific occurrence of one of such driving transitions occurs in a time interval that is associated to the above-mentioned transition, within which the transition itself takes place. Such time interval usually has a short duration compared to the duration of the successive "on" or "off" state of the switch module 200. In other words, the time interval associated to a driving transition can also be regarded as a "fraction" of the "on" state or the "off" state of the switch module 200.

Referring back to the driving device 500 of FIG. 1, it further comprises a driving device 500 control module 510 (hereinafter, for brevity's sake, control module), so configured as to generate a plurality of driving control signals SCP, which will be described herein below, on the basis of one or more system control signals SCS.

The driving device 500 further comprises a driving stage 520 operatively interposed between the control module 510 and the switch module 200. In more detail, the driving stage 520 is configured to receive the plurality of control signals SCP from the control module 510 and to generate, on the basis of the plurality, the driving signal SP. The driving stage 520 will be described in more detail herein below, in some embodiments thereof, with particular reference to FIGS. 2 and 4.

Referring again to FIG. 1, the processing system 100 further comprises a system control digital circuitry 600, arranged to generate, inter alia, one or more system control signals SCS intended to control, through the control module 510, the driving stage 520, and to accordingly determine the operation of the switch module 200. The system control digital circuitry 600, per se known, comprises, for example, a plurality of logical ports and/or components, and can vary depending on the type of the processing system 100 for which it is designed.

The processing system 100 further comprises a first reference terminal T1 and a second reference terminal T2 associated, respectively, to a first reference potential V1 and a second reference potential V2. Such reference potentials (V1, V2) advantageously have a high immunity level compared to disturbances related to the switching of the digital circuitry components with which the processing system 100 is provided. The processing system 100 further comprises a third reference terminal T3 and a fourth reference terminal T4 associated, respectively, to a third reference potential V3 and a fourth reference potential V4. It is pointed out that the third and fourth reference potentials (V3, V4) are advantageously chosen to be electrically distinct, respectively, from the first and the second reference potentials (V1, V2). The processing system 100 further comprises an analog circuitry supply circuitry 10, arranged to provide a first and a second analog supply potentials (VA1, VA2), for example, on corresponding analog supply terminals (TA1, TA2).

Referring to FIG. 1, it shall be noticed that the source module 300 and the user module 400 are operatively connected, in order to be supplied, to the analog supply terminals TA1, TA2. It has to be further noticed that, usually, other analog circuitry components, with which the processing system 100 can be provided (not shown in the Figure), whether they are integrated or not in the same chip of the analog supply circuitry 10 and/or of the other processing system 100 subsystems, can be operatively connected to the analog supply terminals TA1, TA2.

It shall be further noticed that, in the embodiment of the processing system 100 of FIG. 1, the first and the second reference terminals T1, T2 respectively coincide with the analog supply terminals TA1, TA2. Similarly, the first and the second reference potentials V1, V2 respectively coincide with the analog supply potentials VA1, VA2.

In fact, the analog supply potentials VA1 and VA2 usually have, as helpful for the reference potentials V1 and V2, a high immunity level compared to the disturbances related to the switching of the processing system 100 digital circuitry components.

The processing system 100 further comprises a digital circuitry supply circuitry 20, arranged to provide a first digital supply potential VD1 and a second digital supply potential VD2, for example, on respective digital supply terminals TD1, TD2. It shall be further noticed that other digital circuitry components which the processing system 100 can be provided with, whether they are integrated or not in the same chip of the digital supply circuitry 20 and/or of the other processing system 100 subsystems, can be usually operatively connected to the analog supply terminals TD1, TD2.

Referring to FIG. 1, it has to be observed that, for example, the digital control circuitry 600 and the control module 510 are operatively connected, in order to be supplied, to the terminals TD1 and TD2. Referring again to the analog circuitry supply circuitry 10 and to the digital circuitry supply circuitry 20, it has to be observed that, according to different embodiments of the present disclosure, they can be integrated in the same chip that houses the circuitries which they supply, or they can be in one or more different chips.

Referring back to the embodiment of FIG. 1, it shall be noticed that the third and the fourth reference terminals T3, T4 respectively coincide with the digital supply terminals TD1, TD2. Similarly, the third and the fourth reference potentials V3, V4 respectively coincide with the digital supply potentials VD1, VD2.

In fact, the digital supply potentials VD1, VD2, as helpful for the reference potentials V3, V4, usually are electrically distinct from the first and the second reference potentials (V1, V2), respectively.

It has to be observed that the analog supply potential (VA1, VA2) nominal values are usually equal to the digital supply potentials (VD1, VD2) nominal values, respectively, while the corresponding real and instantaneous values can differ from one another, since each of them can vary in time, because of several non-idealities (for example, noise).

Referring again to the example of FIG. 1, the driving stage 520 may be operatively connected both to the pair including of the first and the second reference terminals (T1, T2) and to the pair including of the third and the fourth reference terminals (T3, T4).

Figure 2:
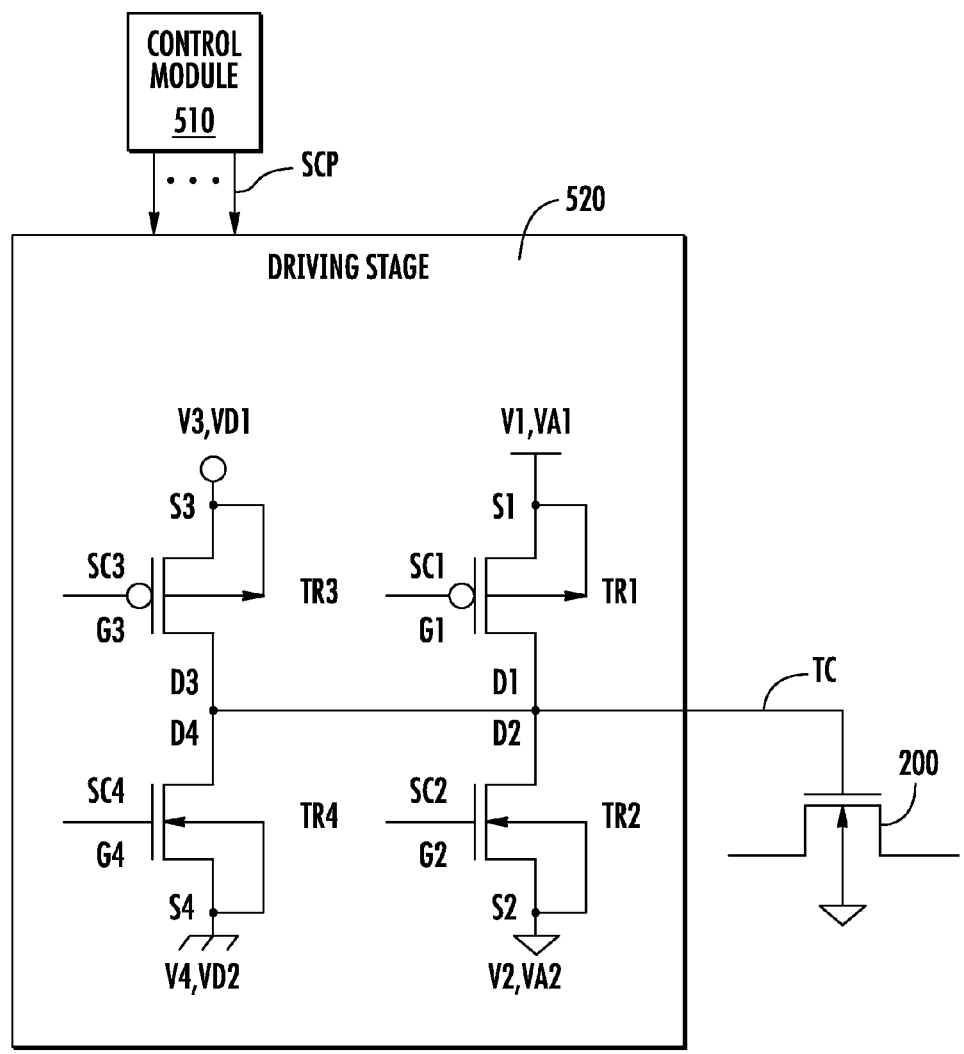
FIG. 2 shows, from a circuit point of view, a driving device and a switch module that are employed in the electronic system of FIG. 1.

With particular reference to FIG. 2, the driving stage 520 is now described, according to an embodiment example. It is pointed out that, for clarity of description, the control module 510 operatively connected to the driving stage 520, as already illustrated before, to provide it with the plurality of driving control signals SCP, and the switch module 200 driven by the driving stage 520 through the control terminal TC, already introduced before, are schematically illustrated in FIG. 2.

The driving stage 520 comprises a first transistor TR1, for example, of the P-channel MOS type, provided with: a first source terminal S1 electrically connected to the first reference potential V1, i.e., to the analog supply potential VA1; a first gate terminal G1 operatively connected to the control module 510 to receive in input a first control signal SC1 belonging to the plurality of driving control signals SCP; a first drain terminal D1, operatively connected to the control terminal TC of the switch module 200.

The driving stage 520 further comprises a second transistor TR2, for example, of the N-channel MOS type, provided with: a second drain terminal D2 connected to the first drain terminal D1 of the first transistor TR1, and, consequently, to the control terminal TC of the switch module 200; a second gate terminal G2 operatively connected to the control module 510 to receive in input a second control signal SC2 belonging to the plurality of driving control signals SCP; a second source terminal S2, electrically connected to the second reference potential V2, i.e., to the analog supply potential VA2.

The driving stage 520 further comprises a third transistor TR3, for example, of the P-channel MOS type, provided with: a third source terminal S3 electrically connected to the third reference potential V3, i.e., to the digital supply potential VD1; a third gate terminal G3 operatively connected to the control module 510 to receive in input a third control signal SC3 belonging to the plurality of driving control signals SCP; a third drain terminal D3, also being operatively connected to the control terminal TC of the switch module 200, as well as to the first drain terminal D1 of the first transistor TR1 and to the second drain terminal D2 of the second transistor TR2.

The driving stage 520 further comprises a fourth transistor TR4, for example, of the N-channel MOS type, provided with: a fourth drain terminal D4 also operatively connected to the control terminal TC of the switch module 200, as well as to the third drain terminal D3 of the third transistor TR3, to the first drain terminal D1 of the first transistor TR1 and to the second drain terminal D2 of the second transistor TR2; a fourth gate terminal G4 operatively connected to the control module 510 to receive in input a fourth control signal SC4 belonging to the plurality of driving control signals SCP; a fourth source terminal S4 electrically connected to the fourth reference potential V4, i.e., to the digital supply potential VD2.

It shall be noticed that the driving stage 520 configuration (FIG. 2) is such that, according to the switching on or off of the first transistor TR1, the second transistor TR2, the third transistor TR3, and the fourth transistor TR4, on the basis of the plurality of driving control signals SCP provided by the control module 510, the control terminal TC can be operatively connected to the first reference potential V1 (i.e., to the analog supply potential VA1), the second reference potential V2 (i.e., the analog supply potential VA2), the third reference potential V3 (i.e., the digital supply potential VD1), or the fourth reference potential V4 (i.e., the digital supply potential VD2).

Figure 3:
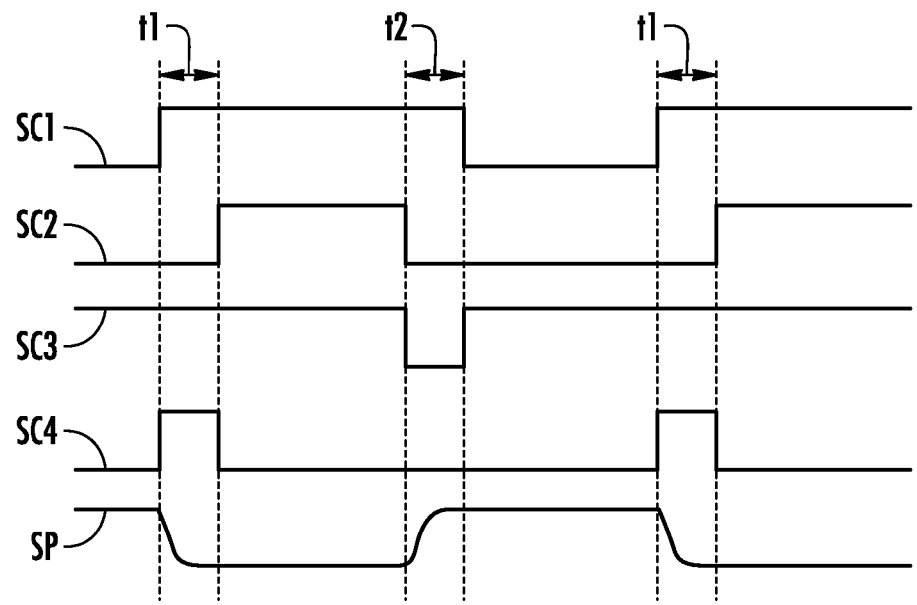
FIG. 3 shows logic signals that are used for controlling the driving device of FIG. 2, in a time evolution diagram.

With particular reference to FIGS. 2 and 3, the operation of the driving device 500 is now described according to the example of FIG. 2. It is assumed that the first state ("on") is initially imposed to the switch module 200. The control module 510 is configured so that the third control signal SC3 is at a high logical level ("1"). It results that the third transistor TR3 is in the "switched off" condition and it behaves as an "open switch" between the respective source S3 and drain D3 terminals.

The control module 510 is further configured so that the fourth control signal SC4 is at a low logical level ("0"). This implies that the fourth transistor TR4 is in the "switched off" condition and acts as an "open switch" between the respective source S4 and drain D4 terminals.

Furthermore, the control module 510 is configured so that the second control signal SC2 is at a low logical level ("0"). This implies the switching off of the second transistor TR2, which behaves as an "open switch", between the respective source S2 and drain D2 terminals.

Finally, the control module 510 is configured so that the first control signal SC1 is at a low logical level ("0"). This implies that the first transistor TR1 is in the "switch on" condition and allows the electric connection between the respective source S1 and drain D1 terminals. Accordingly, the control terminal TC of the switch module 200, operatively connected to the first drain terminal D1, is electrically connected also to the first source terminal S1, and is therefore electrically connected to the first reference potential V1, i.e., to the analog supply potential VA1. The first reference potential V1 has such a value as to correspond to a "high" logical level ("1"). Therefore, in the described configuration, the driving signal SP, which is present at the control terminal TC of the switch module 200, results corresponds to a "high" logical level, with which it imposes the first state ("on") of the switch module 200.

With particular reference to the time diagram of FIG. 3, it shall be noticed that, each time that it is desired that the switch module 200 carries out the first transition (from the first state "on" to the second state "off"), the control module 510 is configured so that the third control signal SC3 is maintained to a high logical level ("1"); the second control signal SC2 is maintained to a low logical level ("0"); the first control signal SC1 is brought to a high logical level ("1"), in which the first transistor TR1 electrically disconnects the first drain terminal D1, and accordingly the control terminal TC, from the first source terminal S1, and therefore from the first reference potential V1; the fourth control signal SC4 is brought to a high logical level ("1"), in which the fourth transistor TR4 electrically connects the fourth drain terminal D4, and accordingly the control terminal TC, to the fourth source terminal S4, and therefore to the fourth reference potential V4, i.e., to the digital supply potential VD2.

In such configuration, the transistor TR1 behaves as an "open switch", while the transistor TR4 behaves as a "closed switch". Furthermore, the fourth reference potential V4 has such a value corresponding to a "low" logical level ("0"). Therefore, the driving signal SP present at the control terminal TC passes, during the first transition, from a "high" logical level to a "low" logical level, with which it imposes the corresponding transition from the first state "on" to the second state "off" to the switch module 200.

This advantageously allows the switching current, associated with the above-mentioned transition of the driving signal SP, to flow through the digital supply terminal TD2 associated to the fourth reference potential V4, i.e., to the digital supply potential VD2.

Referring again to FIGS. 2 and 3, the case in which the second state ("off") is imposed to the switch module 200 is now described.

The control module 510 is configured so that the third control signal SC3 is maintained to a high logical level ("1"); the first control signal SC1 is maintained to a high logical level ("1"). Furthermore, the control module 510 is configured so that the fourth control signal SC4 is brought to a "low" logical level ("0"), in which the fourth transistor TR4 electrically disconnects the fourth drain terminal D4, and accordingly the control terminal TC, from the fourth source terminal S4, and therefore from the fourth reference potential V4, i.e., from the digital supply potential VD2. Finally, the control module 510 is configured so that the second control signal SC2 is brought to a "high" logical level ("1") in which the second transistor TR2 electrically connects the second drain terminal D2, and accordingly the control terminal TC, to the second source terminal S2, and therefore to the second reference potential V2, i.e., to the analog supply potential VA2.

In such configuration, the fourth transistor TR4 behaves as an "open switch", while the second transistor TR2 behaves as a "closed switch". Furthermore, the second reference potential V2 has a value corresponding to a "low" logical level ("0"). Therefore, in the described configuration, the driving signal SP present at the control terminal TC of the switch module 200 corresponds to a "low" logical level, with which it imposes the second state ("off") of the switch module 200.

With particular reference to the time diagram of FIG. 3, it shall be noticed that each time that it is desired that the switch module 200 carries out the second transition (from the second state "off" to the first state "on"), the control module 510 is configured so that the first control signal SC1 is maintained at a high logical level ("1"); the fourth control signal SC4 is maintained at a low logical level ("0"); the second control signal SC2 is brought to a low logical level ("0"), in which the second transistor TR2 electrically disconnects the second drain terminal D2, and accordingly the control terminal TC, from the second source terminal S2, and therefore from the second reference potential V2, i.e., from the analog supply potential VA2; the third control signal SC3 is brought to a low logical level ("0"), in which the third transistor TR3 electrically connects the third drain terminal D3, and accordingly the control terminal TC, to the third source terminal S3, and therefore to the third reference potential V3, i.e., to the digital supply potential VD1.

In such configuration, the transistor TR2 behaves as an "open switch", while the transistor TR3 behaves as a "closed switch". Furthermore, the third reference potential V3 has such a value as to correspond to a "high" logical level ("1"). Therefore, the driving signal SP present at the control terminal TC passes, during the second transition, from a "low" logical level to a "high" logical level, with which it imposes to the switch module 200 the corresponding transition from the second state "off" to the first state "on".

This advantageously allows the switching current, associated to the above-mentioned transition of the driving signal SP, to flow through the digital supply terminal TD1 associated to the third reference potential V3, i.e., to the digital supply potential VD1.

The time sequence described above restarts then from a period in which the switch module 200 is maintained in its first state "on", since at the end of the time interval associated to the second "off/on" transition, the control module 510 is configured to bring the third control signal SC3 to a "high" logical level, and the first control signal SC1 to a "low" logical level, returning, actually, to the situation already described with reference to the first state "on" of the switch module 200.

With particular reference now to FIG. 3 only, it shall be noticed that each of the time intervals associated to the first driving transition has a duration t1 and each of the time intervals associated to the second driving transition has a duration t2. Usually, the durations t1, t2 of such time intervals are much shorter than the duration of the time intervals in which the switch module 200 is maintained in the first state "on" or the second state "off". The duration values t1 and t2 are usually similar, and can also be equal one to the other.

From an operative point of view, the time sequence, illustrated in FIG. 3 and described before, allows the control, through the control terminal TC, of the operation of the switch module 200, by imposing on it one or the other of the "on" and "off" states and, when helpful, one or the other of the first and second transitions.

Furthermore, the driving device 500 described above helps ensure that, advantageously, during the "on" and "off" states, the control terminal TC is connected to the first and the second reference potentials V1 and V2, respectively, which, as already noticed, suitably have a high immunity level compared to disturbances related to the switching of the digital circuitry components of the processing system 100 itself. Particularly, as in the example shown (FIG. 2), the first and second reference potentials V1 and V2 can coincide with the analog supply potentials VA1 and VA2, respectively, which are not affected by the influence of sudden digital switching operations of the processing system 100 digital circuitry, which is electrically connected to the digital supply potentials (VD1, VD2).

This advantageously implies that the switch module 200 is insulated from the noise that is present on the digital supply potentials, during the time intervals in which it is in the "on" state or the "off" state, that is, for a predominant part of its operation time. Accordingly, the switch module 200 performance will be appreciably improved, in terms of noise minimization and integrity preservation of the analog signal SA', the trend of which approaches to the ideal one, already described.

Going even further, the driving device 500 described above helps ensure that, in the time intervals associated to the transitions from the "on" state to the "off" state, and vice versa, the control terminal TC is instead electrically connected to the further third and fourth reference potentials V3 and V4, which are, as already known, electrically distinct from the analog supply potentials VA1, VA2.

This very advantageously allows electrically insulating the analog supply potentials VA1, VA2 from the switching currents, which are relatively ample and suddenly variable, associated to the transition of the driving signal SP from a "high" logical level to a "low" one, or vice versa, during the respective first and second transitions of the switch module 200.

Therefore, the disturbances introduced on the analog supply potentials VA1, VA2 may be drastically reduced, (ideally reduced to zero), and the performance degradations of a part or even of the entire analog circuitry of the processing system 100 may be minimized accordingly, degradations which could be unacceptable for the operation of the processing system 100 itself.

Inter alia, it shall be noticed that, advantageously, also the distortions introduced on the analog signals SA, SA' through the source module 300 and the user module 400 are minimized. It shall be noticed that, in the embodiment of the processing system 100 of FIG. 2, the third and fourth reference potentials V3, V4 coincide with the digital supply potentials VD1 and VD2, respectively, which are electrically distinct from the analog supply potentials VA1 and VA2, as required.

Finally, it shall be noticed that, despite the fact that in the intervals in which the driving signal SP is connected to the digital supply potentials VD1, VD2 a relatively high noise (related to the digital supply) is present, this does not create relevant problems. In fact, the time intervals associated to the above-mentioned transitions are usually very short compared to the time intervals associated to the "on" and "off" states.

In the embodiment illustrated in FIG. 2, the driving stage 520 allows the general case in which the switching currents associated both to the first and to the second transitions of the switch module 200 are "conveyed" on digital supply potentials, when the processing system 100 operation requires to avoid disturbances on both the analog supply potentials (VA1 and VA2).

However, there are cases in which the disturbances to be obviated originate from the switching current associated to only one of the two transitions ("on/off", "off/on"). To this aim, the driving device 500 of FIG. 2 is conveniently modified.

Figure 4:
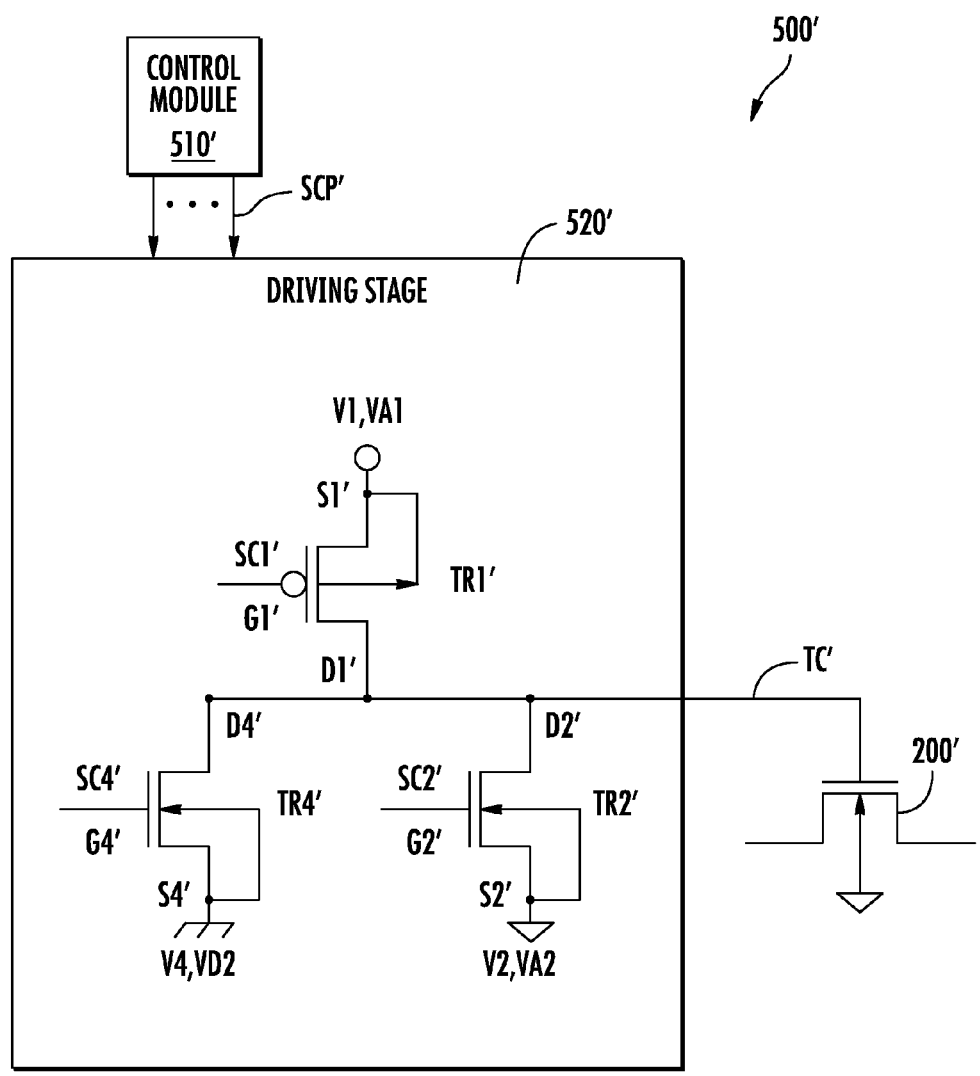
FIG. 4 illustrates, from a circuit point of view, a further driving device and a switch module that are used in an electronic system according to a further example of this disclosure.

By way of example, with reference to FIG. 4, a driving device 500' is now described, which can be used in the case in which the switching current associated to the second transition ("off/on") does not create disturbances and/or problems in the processing system 100, even when it flows through the analog supply terminal TA1, disturbing, during the transition itself, the relative analog supply potential VA1.

The driving device 500' of FIG. 4 comprises a control module 510', a driving stage 520', and a switch module 200' (completely analogous to the switch module 200 of FIG. 2). From a circuital point of view, the driving stage 520' results to be completely analogous to the driving stage 520, except for the fact that it results to be lacking in the third transistor TR3.

Particularly, the driving stage 520' comprises: a first transistor TR1', analogous to the first transistor TR1 employed in the driving stage 520; a second transistor TR2', analogous to the second transistor TR2 employed in the driving stage 520; a further transistor TR4', analogous to the fourth transistor TR4 employed in the driving stage 520.

The circuital connections of the respective drain (D1', D2', D4') and source (S1', S2', S4') terminals of the transistors (TR1', TR2', TR4') employed in the driving stage 520' are analogous to circuital connections of the drain (D1, D2, D4) and source (S1, S2, S4) terminals of the first (TR1), second (TR2), and fourth (TR4) transistors of the driving stage 520, respectively.

With regard to the control module 510', it is configured to generate a further plurality of driving control signals SCP' to be provided to the driving stage 520'. Particularly, the further plurality of driving control signals SCP' comprises a first SC1', a second SC2', and a further SC4' driving control signals, which are provided to a first G1', second G2', further G4' gate terminals, respectively, with which the transistors TR1', TR2', TR4' are provided, respectively.

Figure 5:
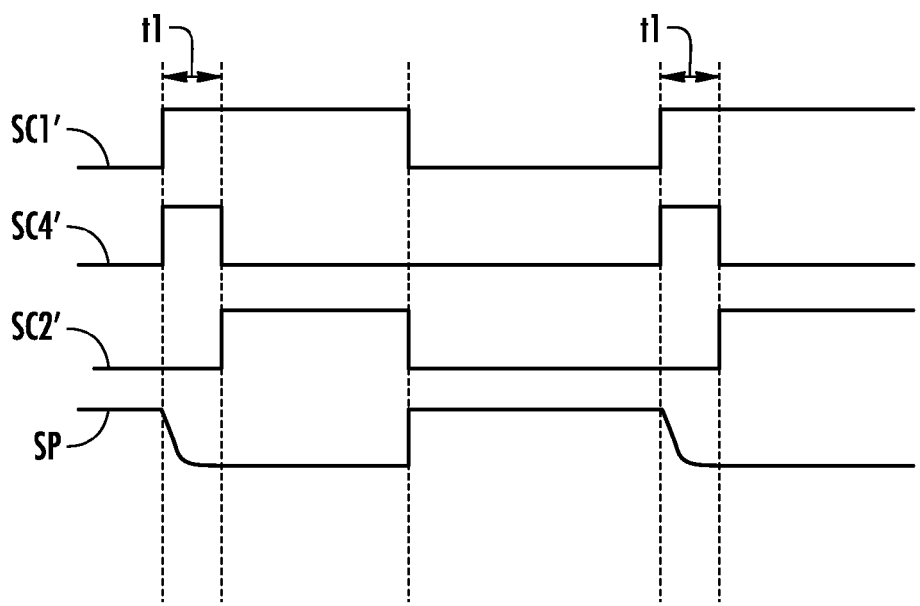
FIG. 5 shows logic signals that are used for controlling the driving device of FIG. 4, in a time evolution diagram.

Referring to FIGS. 4 and 5, the operation of the driving stage 520' is now described. It shall be noticed that the configuration of the driving stage 520' of FIG. 4 is such that, according to the switching on or switching off of the first transistor TR1', of the second transistor TR2', of the further transistor TR4', the control terminal TC', with which the switch module 200' is provided, can be operatively connected: to the first reference potential V1 (i.e., to the analog supply potential VA1) during the first state "on" and during the second transition "off/on" of the switch module 200'; to the second reference potential V2 (i.e., to the analog supply potential VA2) during the second state "off" of the switch module 200'; to the fourth reference potential V4 (i.e., to the digital supply potential VD2) during the first transition "on/off" of the switch module 200'.

The switching off and on of the transistors TR1', TR2', TR4', according to the modes described above, occurs on the basis of the further plurality of driving control signals SCP' provided by the control module 510', according to the time evolution diagram illustrated in FIG. 5.

The driving stage 520' of FIG. 4 is satisfactory in the particular cases in which the switch current associated to the first transition "on/off" creates disturbances and/or problems in the processing system 100, when it flows through the analog supply terminal TA2, perturbing, during the transition itself, the relative analog supply potential VA2.

This situation can occur, for example, when the processing system 100 is an ADC converter in which analog samples voltage values of the analog signal SA' are stored after the switch module 200 (200') is "switched off" (that is, after the first transition "on/off"), referring the relative voltage measure to an analog ground potential (such as, for example, VA2). In this case, the fact of avoiding that the "analog ground" (that is, the potential VA2) is perturbed during the first transition "on/off" of the switch module 200 (200'), advantageously allows minimizing distortions in the measurement of the stored voltage value. On the other hand, in this particular case, there are not strict requirements about the second transition "off/on" of the switch module 200 (200').

Therefore, in a case as the one described above, the embodiment of FIG. 4 meets the desired characteristics, further resulting simpler, from a circuital point of view, compared to the embodiment of FIG. 2. Similarly, the further "dual" embodiment of the one in FIG. 4 can be understood, which is not illustrated, as being easily inferable by those of ordinary skill in the art, in light of the embodiments in FIGS. 2 and 4.

Such further embodiment comprises two transistors, for example, of the P-channel MOS type, the respective source terminals of which are connected to the analog supply potentials VA1 and to the digital supply potential VD1, respectively; and a further transistor, for example, of the N-channel MOS type, the source terminal of which is connected to the analog supply potential VA2. The operation of such embodiment can be easily inferred by those of ordinary skill in the art, mutatis mutandis, by observing the embodiment in FIGS. 2 and 4.

Referring to the different embodiments hereto described, the driving control module (510, 510'), arranged to generate the plurality of driving control signals (SCP, SCP'), can be implemented through logical ports and/or components, according to various combinations and/or configurations, which are anyhow known to those of ordinary skill in the art.

For example, it is considered the case in which the control module 510, after receiving a system control signal SCS1 (which is, for example, the signal used to generate the driving signal SP, for example, by an "inverter") from the digital control circuitry 600, generates, on the basis of this, the plurality of driving control signals SCP (SCP') (FIGS. 3 and 5). Those of ordinary skill in the art, by examining the time evolution diagrams in FIGS. 3 and 5, can easily find that the control signals can be generated starting from the system control signal SCS1, through the generation of a further auxiliary signal (which is, for example, the logical inverse of the system control signal SCS1, delayed by a time value t1, in the case of FIG. 5 in which t1 is equal to t2) and through a suitable combination, through logical operations, of the system control signal SCS1 and the further auxiliary signal.

Optional modifications of the control module 510 (510'), accessible to those of ordinary skill in the art, can be for example provided for in the case in which the above-mentioned time values t1 and t2 are selected so as to have mutually different values (as in the example of FIG. 3).

Therefore, to such purposes, the control module 510 (510') can be implemented through a network of logical ports (for example, OR, AND, NOR, NAND) to which analog and/or digital members are added to achieve the desired delays. With regard to the switch module 200, it shall be noticed that in the described examples it preferably comprises only one analog signal pass transistor. However, the present disclosure applies also in the case in which the switch module comprises more "pass transistors", for example, a N-channel one and a P-channel one in parallel (for example, to operate on analog signals with higher amplitude ranges). In such case, to drive the thus-configured switch module, a driving device could be suitably used, comprising more driving stages, bearing in mind the teachings of the present disclosure.

As it can be observed, the object of the present disclosure is fully achieved, since the processing system 100 can advantageously reduce in a remarkable way the noise associated to the driving of the switch module during the "on" and "off" states. At the same time, the processing system of the disclosure further allows minimizing the disturbances on the entire analog circuitry of the processing system 100 during the switch module transitions from one to the other of its states. In these aspects, the processing system 100, and particularly the driving device 500, can therefore achieve a better performance compared to those that can be achieved by the known solutions.

To the embodiments of the processing system described above, those of ordinary skill in the art, in order to meet contingent needs, will be able to make modifications, adaptations, and replacements of elements with functionally equivalent other ones, without departing from the scope of the following claims. Each of the characteristics described as belonging to a possible embodiment can be implemented independently from the other embodiments described.

That which is claimed

1. A system for processing analog electrical signals comprising:
    analog circuitry supply circuitry configured to provide first and second analog supply potentials;
    a switch module having a control terminal and being switchable between a first state and a second state to thereby enable and inhibit, respectively, transfer of an analog electrical signal from a source module to a user module, based upon a driving electrical signal;
    a driving device configured to drive, based upon the driving electrical signal, the control terminal of the switch module, to cause the switch module to assume one of the first state and the second state, the driving device further allowing the switch module to carry out a first driving transition from the first state to the second state and a second driving transition from the second state to the first state;
    the driving device being configured to alternately couple the control terminal to a first reference potential during the first state and to a second reference potential during the second state;
    the driving device being further configured to couple the control terminal of the switch module to a third reference potential electrically distinct from the first and second analog supply potentials, during each time interval associated with at least one of the first and second driving transitions of the switch module.

2. The system according to claim 1, wherein the driving device is configured to couple the control terminal of the switch module to a fourth reference potential electrically distinct from the first and second analog supply potentials, the control terminal being coupled to the third and fourth reference potentials during each time interval associated to the first and second transitions of the switch module, respectively.

3. The system according to claim 1, wherein the first reference potential and the second reference potential are based upon the first analog supply potential and the second analog supply potential, respectively.

4. The system according to claim 1, further comprising digital supply circuitry configured to provide first and a second digital supply potentials; and wherein the third reference potential and the fourth reference potential are based upon the first digital supply potential and the second digital supply potential, respectively.

5. The system according to claim 1, wherein the driving device comprises a driving stage; and further comprising digital control circuitry configured to provide at least one system control signal to the driving device, the control module being configured to generate a plurality of driving control signals based upon the at least one system control signal.

6. The system according to claim 5, wherein the driving stage is configured to generate the driving electrical signal based upon the plurality of driving control signals.

7. The system according to claim 1, wherein the driving stage comprises a first transistor having a first source terminal coupled to the first reference potential, a first gate terminal coupled to the control module to receive a first control signal of the plurality of driving control signals, and a first drain terminal coupled to the control terminal of the switch module.

8. The system according to claim 7, wherein the driving stage further comprises a second transistor having a second drain terminal coupled to the first drain terminal of the first transistor, a second gate terminal coupled to the control module to receive a second control signal of the plurality of driving control signals, and a second source terminal coupled to the second reference potential.

9. The system according to claim 8, wherein the driving stage further comprises a further transistor having a further drain terminal coupled to the first drain terminal of the first transistor, a further gate terminal coupled to the control module to receive a further control signal of the plurality of driving control signals, and a further source terminal coupled to the fourth reference potential.

10. The system according to claim 9, wherein the driving stage further comprises another transistor having another source terminal coupled to the third reference potential, another gate terminal operatively coupled to the control module to receive another control signal of the plurality of driving control signals, and a further drain terminal coupled to the first drain terminal of the first transistor.

11. A system for processing analog electrical signals and to be coupled to first and second analog supply potentials, the system comprising:
    a switch module having a control terminal and being switchable between a first state and a second state to thereby enable and inhibit, respectively, transfer of an analog electrical signal from a source module to a user module, based upon a driving electrical signal;
    a driving device configured to drive, based upon the driving electrical signal, the control terminal of the switch module, to cause the switch module to assume one of the first state and the second state, the driving device further allowing the switch module to carry out a first driving transition from the first state to the second state and a second driving transition from the second state to the first state;

the driving device being configured to alternately couple the control terminal to a first reference potential during the first state and to a second reference potential during the second state;

the driving device being further configured to couple the control terminal of the switch module to a third reference potential electrically distinct from the first and second analog supply potentials, during each time interval associated with at least one of the first and second driving transitions of the switch module.

12. The system according to claim 11, wherein the driving device is configured to couple the control terminal of the switch module to a fourth reference potential electrically distinct from the first and second analog supply potentials, the control terminal being coupled to the third and fourth reference potentials during each time interval associated to the first and second transitions of the switch module, respectively.

13. The system according to claim 11, wherein the first reference potential and the second reference potential are based upon the first analog supply potential and the second analog supply potential, respectively.

14. The system according to claim 11, further comprising digital supply circuitry configured to provide first and a second digital supply potentials; and wherein the third reference potential and the fourth reference potential are based upon the first digital supply potential and the second digital supply potential, respectively.

15. The system according to claim 11, wherein the driving device comprises a driving stage; and further comprising digital control circuitry configured to provide at least one system control signal to the driving device, the control module being configured to generate a plurality of driving control signals based upon the at least one system control signal.

16. The system according to claim 14, wherein the driving stage is configured to generate the driving electrical signal based upon the plurality of driving control signals.

17. A method of processing analog electrical signals comprising:

using a switch module having a control terminal and being switchable between a first state and a second state to enable and inhibit, respectively, transfer of an analog electrical signal from a source module to a user module based upon a driving electrical signal;

driving the control terminal of the switch module to cause the switch module to assume one of the first state and the second state based upon the driving electrical signal, using a driving device to thereby allow the switch module to carry out a first driving transition from the first state to the second state and a second driving transition from the second state to the first state;

alternately coupling the control terminal to a first reference potential during the first state and to a second reference potential during the second state using the driving device;

coupling the control terminal of the switch module to a third reference potential electrically distinct from the first and second analog supply potentials, during each time interval associated with at least one of the first and second driving transitions of the switch module, using the driving device.

18. The method according to claim 17, further comprising coupling the control terminal of the switch module to a fourth reference potential electrically distinct from the first and second analog supply potentials and coupling the control terminal to the third and fourth reference potentials during each time interval associated to the first and second transitions of the switch module, respectively.

19. The method according to claim 17, wherein the first reference potential and the second reference potential are based upon the first analog supply potential and the second analog supply potential, respectively.

20. The method according to claim 17, wherein the third reference potential and the fourth reference potential are based upon a first digital supply potential and a second digital supply potential, respectively.

* * * * *